(12) United States Patent
Lee

(10) Patent No.: US 11,955,718 B2
(45) Date of Patent: Apr. 9, 2024

(54) WATERPROOF MICROPHONE KIT AND ELECTRONIC DEVICE

(71) Applicant: GETAC HOLDINGS CORPORATION, Taoyuan (TW)

(72) Inventor: Kun-Cheng Lee, Taipei (TW)

(73) Assignee: GETAC HOLDINGS CORPORATION, Taoyuan (TW)

( * ) Notice: Subject to any disclaimer, the term of this patent is extended or adjusted under 35 U.S.C. 154(b) by 0 days.

(21) Appl. No.: 17/402,534

(22) Filed: Aug. 14, 2021

(65) Prior Publication Data

US 2022/0197350 A1 Jun. 23, 2022

Related U.S. Application Data

(60) Provisional application No. 63/130,310, filed on Dec. 23, 2020.

(51) Int. Cl.

| G06F 1/16 | (2006.01) |
|---|---|
| H01Q 1/22 | (2006.01) |
| H01Q 1/24 | (2006.01) |
| H01Q 5/30 | (2015.01) |
| H01Q 21/28 | (2006.01) |
| H04R 1/04 | (2006.01) |
| H05K 7/14 | (2006.01) |

(52) U.S. Cl.
CPC ........... *H01Q 21/28* (2013.01); *G06F 1/1684* (2013.01); *H01Q 1/2266* (2013.01); *H01Q 1/243* (2013.01);
(Continued)

(58) Field of Classification Search
CPC .... G06F 1/1616; G06F 1/1626; G06F 1/1656; G06F 1/1684; G06F 1/1688; G06F 1/1605; H05K 7/1427; H05K 5/03; H05K 5/0217; H05K 5/0247; H04R 1/086; H04R 1/023; H04R 1/025; H04R 1/28; H04R 1/222;
(Continued)

(56) References Cited

U.S. PATENT DOCUMENTS

| 6,353,185 B1 * | 3/2002 | Sakata ...................... H02G 3/18 |
|---|---|---|
| | | 174/152 G |
| 2006/0109996 A1 * | 5/2006 | Larson ..................... H04N 7/18 |
| | | 381/86 |

(Continued)

FOREIGN PATENT DOCUMENTS

EP 3668109 A1 * 6/2020 ............ H04M 1/035

*Primary Examiner* — Adrian S Wilson
*Assistant Examiner* — Gage Crum
(74) *Attorney, Agent, or Firm* — Cooper Legal Group, LLC

(57) ABSTRACT

The present invention discloses a waterproof microphone kit adapted to be fixed in an electronic device. The waterproof microphone kit includes a housing, a waterproof breathable film, a plug, a circuit motherboard, a microphone unit and a flexible electrical connection component. Two adjacent sides of the housing are provided with an opening and a lateral opening. The waterproof breathable film is disposed at the housing and seals the lateral opening. The plug plugs the opening. The plug, the waterproof breathable film and the housing jointly form an enclosed space. The circuit motherboard is disposed in the housing. The microphone unit is disposed at the circuit motherboard, and a sound receiving part thereof faces the waterproof breathable film. The flexible electrical connection component is connected to the circuit motherboard, and passes through a through hole of the plug so as to connect to an external processing module.

20 Claims, 7 Drawing Sheets

(52) U.S. Cl.
CPC ................. *H01Q 5/30* (2015.01); *H04R 1/04* (2013.01); *H05K 7/1427* (2013.01)

(58) Field of Classification Search
CPC .. H04R 2499/11; H04R 2499/15; H04R 1/04; H04R 1/08; H02G 15/013; H02G 3/288; H04M 1/026
USPC .................................................... 361/679.26
See application file for complete search history.

(56) References Cited

U.S. PATENT DOCUMENTS

| | | | |
|---|---|---|---|
| 2007/0095562 A1* | 5/2007 | Tsai ....................... | H05K 1/118 |
| 2008/0075313 A1* | 3/2008 | Lan ........................ | H04R 1/342 |
| | | | 381/357 |
| 2012/0045081 A1* | 2/2012 | Mittleman ............ | H04M 1/035 |
| | | | 361/679.01 |
| 2013/0051587 A1* | 2/2013 | Stephanou ............. | H04R 23/02 |
| | | | 29/25.35 |
| 2013/0070950 A1* | 3/2013 | Chen ...................... | H04R 1/222 |
| | | | 381/353 |
| 2014/0072141 A1* | 3/2014 | Cohen ..................... | H04R 1/04 |
| | | | 381/91 |
| 2018/0123236 A1 | 5/2018 | Gils et al. | |
| 2018/0356861 A1* | 12/2018 | Ichikawa .............. | G06F 1/1688 |
| 2020/0021015 A1 | 1/2020 | Yun et al. | |
| 2020/0021040 A1 | 1/2020 | Yong et al. | |
| 2020/0059006 A1 | 2/2020 | Kojima | |
| 2021/0088979 A1* | 3/2021 | Son ........................ | H04R 1/026 |
| 2021/0280981 A1 | 9/2021 | Kim et al. | |

* cited by examiner

WATERPROOF MICROPHONE KIT AND ELECTRONIC DEVICE

CROSS-REFERENCE TO RELATED APPLICATIONS

The present application claims the benefit of U.S. Provisional Patent Application No. 63/130,310, filed on Dec. 23, 2020, the disclosure of which is hereby incorporated by reference herein in its entirety.

BACKGROUND OF THE INVENTION

Field of the Invention

The present invention relates to a microphone kit and an electronic device, and more particularly to a waterproof microphone kit suitable for being arranged in an electronic device and an electronic device including the waterproof microphone kit.

Description of the Prior Art

Microphone units in current common laptop computers or tablet computers are non-waterproof. Thus, when a waterproof mechanism such as a related waterproof tape in a housing of a laptop computer or a tablet computer fails, the microphone unit becomes susceptible to moisture, causing a problem of inability of normal operation.

SUMMARY OF THE INVENTION

The present invention discloses a waterproof microphone kit and an electronic device primarily for improving the lack of waterproofness of a conventional microphone unit in an electronic device. In the event of a failure of a waterproof mechanism of the electronic device, such conventional microphone unit becomes susceptible to moisture, causing a problem of inability of normal operation.

A waterproof microphone kit is disclosed according to an embodiment of the present invention. The waterproof microphone kit, adapted to be fixed in an electronic device, includes: a housing, having an opening on one end thereof and a lateral opening on one side thereof; a waterproof breathable film, disposed in the housing and sealing the lateral opening; a plug, partially disposed in the housing and having a through hole, wherein the waterproof breathable film, the plug and the housing jointly form an enclosed space; a circuit motherboard, disposed in the housing and located in the enclosed space; a microphone unit, disposed at the circuit motherboard and located in the enclosed space, a sound receiving part of the microphone unit disposed as facing the waterproof breathable film; a flexible electrical connection component, passing through the though hole, the flexible electrical connection component having one end thereof connected to the circuit motherboard and one other end thereof for connecting to an external processing module.

An electronic device is disclosed according to another embodiment of the present invention. The electronic device includes: a body, including a processing module; a display unit, connected to the body and electrically connected to the processing module, wherein the processing module is capable of controlling the display unit; a waterproof microphone kit, disposed at the body, the waterproof microphone kit including: a housing, having an opening on one end thereof and a lateral opening on one side thereof; a waterproof breathable film, disposed in the housing and sealing the lateral opening; a plug, partially disposed in the housing and having a through hole, wherein the waterproof breathable film, the plug and the housing jointly form an enclosed space; a circuit motherboard, disposed in the housing and located in the enclosed space; a microphone unit, disposed at the circuit motherboard and located in the enclosed space, a sound receiving part of the microphone unit disposed as facing the waterproof breathable film; a flexible electrical connection component, passing through the though hole, the flexible electrical connection component having one end thereof connected to the circuit motherboard and one other end thereof for connecting to an external processing module.

In conclusion, the waterproof microphone kit and the electronic device of the present invention provide waterproofness using designs of the housing, the waterproof breathable film and the plug. Thus, the microphone becomes unlikely affected by external moisture caused by poor waterproofness of the housing of the electronic device, eliminating the problem of inability of operation.

To better understand the features and technical contents of the present invention, details of the present invention are given with the accompanying drawings below. However, the description and the accompanying drawings are for explaining the present invention and are not to be construed as limitations to the scope of protection of the present invention.

DETAILED DESCRIPTION OF THE EMBODIMENTS

Figure 1:
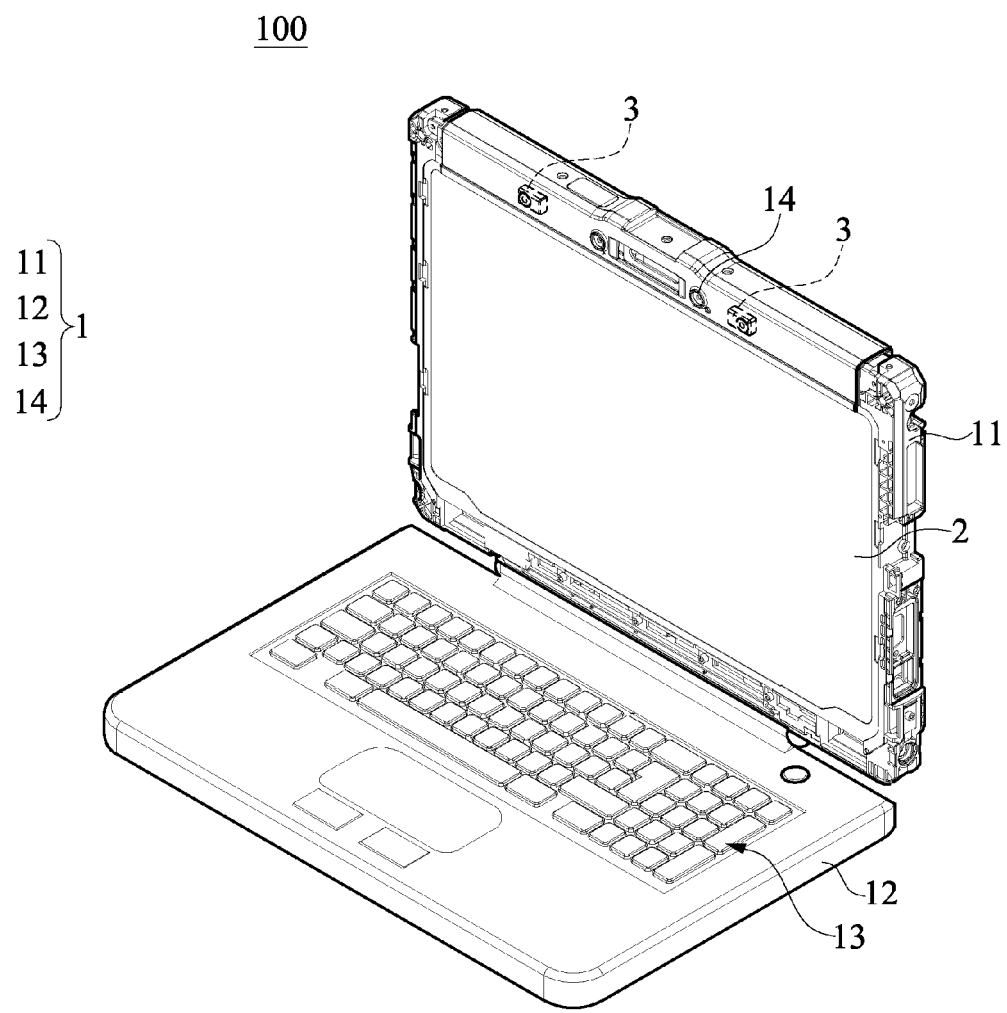
FIG. 1 is a schematic diagram of an electronic device of the present invention.

In the description below, if it is pointed out that reference is made to a specific drawing or is as shown in a specific drawing, such is for emphasizing that most of related details given in the description are illustrated in the specific drawing; however, it does not mean that reference can be made only to the specific drawings in the following description.

Referring to FIG. 1 to FIG. 4, an electronic device 100 of the present invention includes a body 1, a display unit 2 and a waterproof microphone kit 3. In the drawings of the embodiment, a laptop computer is taken as an example of the electronic device 100. However, the electronic device 100 of the present invention is not limited to applications of a laptop computer, and the electronic device 100 of the present invention may also be applied as a tablet computer or a smartphone. As the electronic device 100 of the present invention includes the waterproof microphone kit 3, the electronic device 100 of the present invention is in particular suitable in an application of a rugged laptop computer.

The body 1 includes a first body housing 11, a second body housing 12, a processing module and a keyboard assembly 13. The first body housing 11 covers the display device 2, the processing module is disposed in the second body housing 12, and a part of the keyboard assembly 13 is disposed in the second body housing 12. The first body housing 11 and the second body housing 12 can be movably connected to each other, and the processing module is electrically connected to the display unit 2 and the keyboard assembly 13. The processing module herein refers to related electronic components necessary for maintaining the fundamental operation of the electronic device 100, for example, a motherboard, a central processor, and a storage unit (e.g., a hard drive and a memory). The processing module is capable of controlling the operation of the display unit 2. In practice, the display unit 2 may be a touch display, or the display unit 2 may be a common screen without a touch function; such is not specifically defined herein. Components specifically included in the body 1 may vary according to a product of the actual application of the electronic device 100. For example, when the electronic device 100 is applied as a tablet computer having a touch panel, the body 1 may include only one single housing but does not have the keyboard assembly 13.

Figure 2:
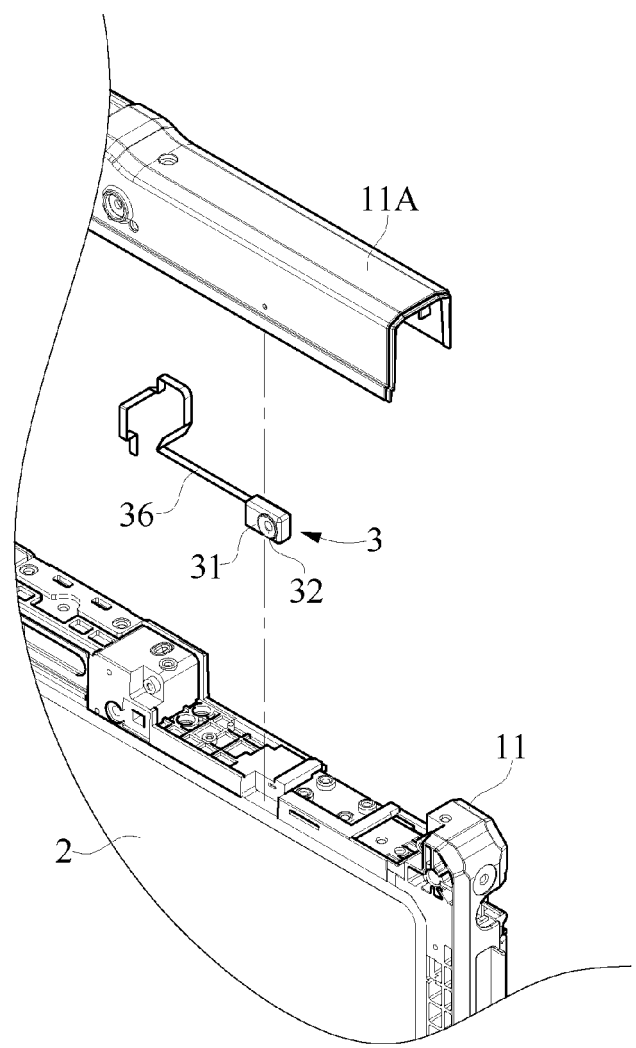
FIG. 2 and FIG. 3 are exploded partial schematic diagrams of an electronic device of the present invention.
Figure 3:
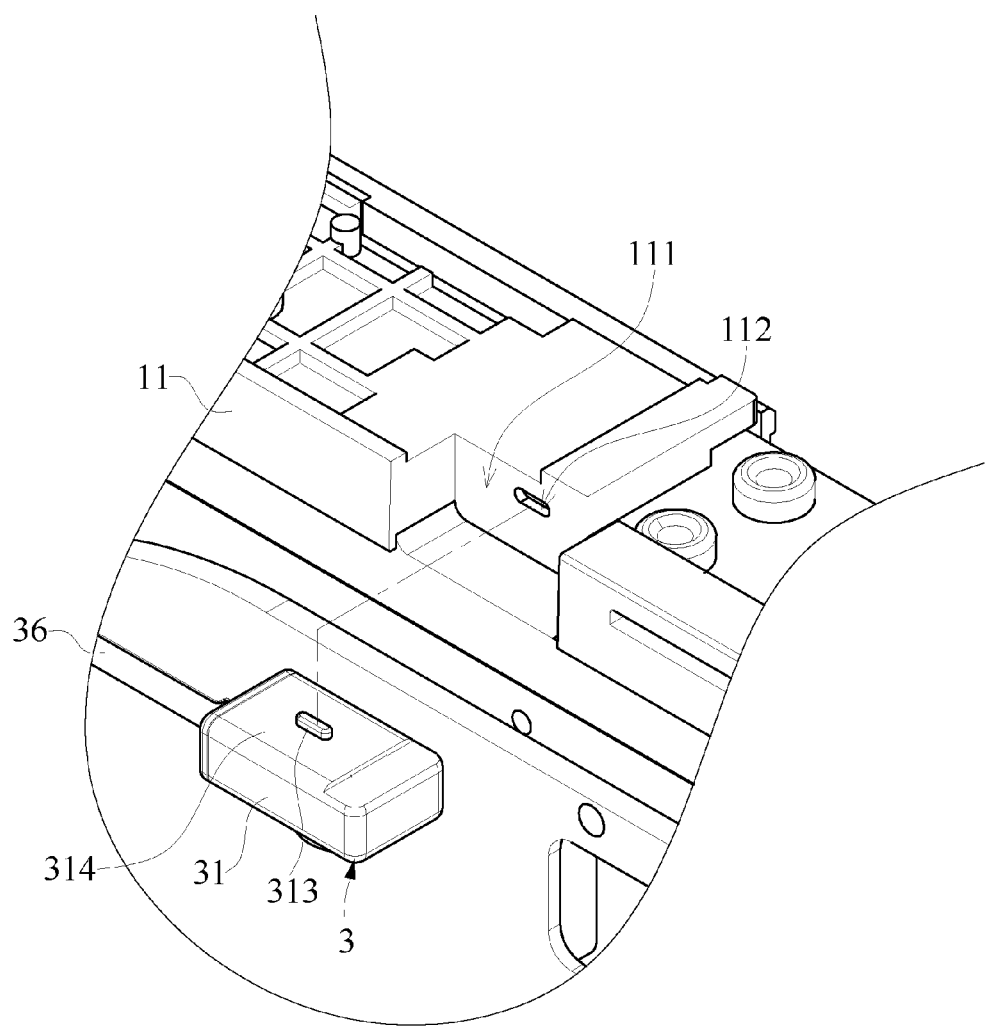
Figure 4:
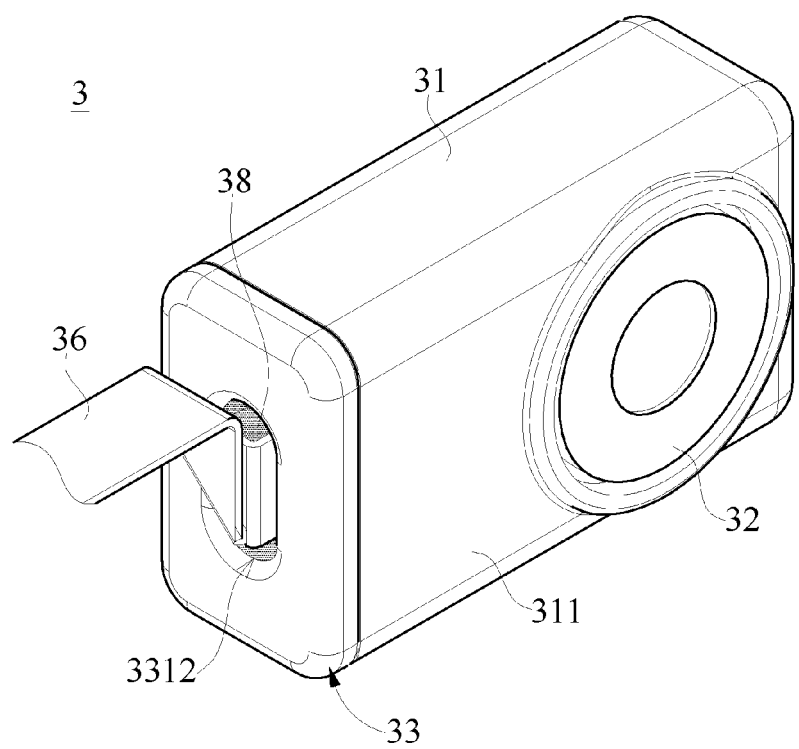
FIG. 4 is a schematic diagram of a waterproof microphone kit of the present invention.
Figure 5:
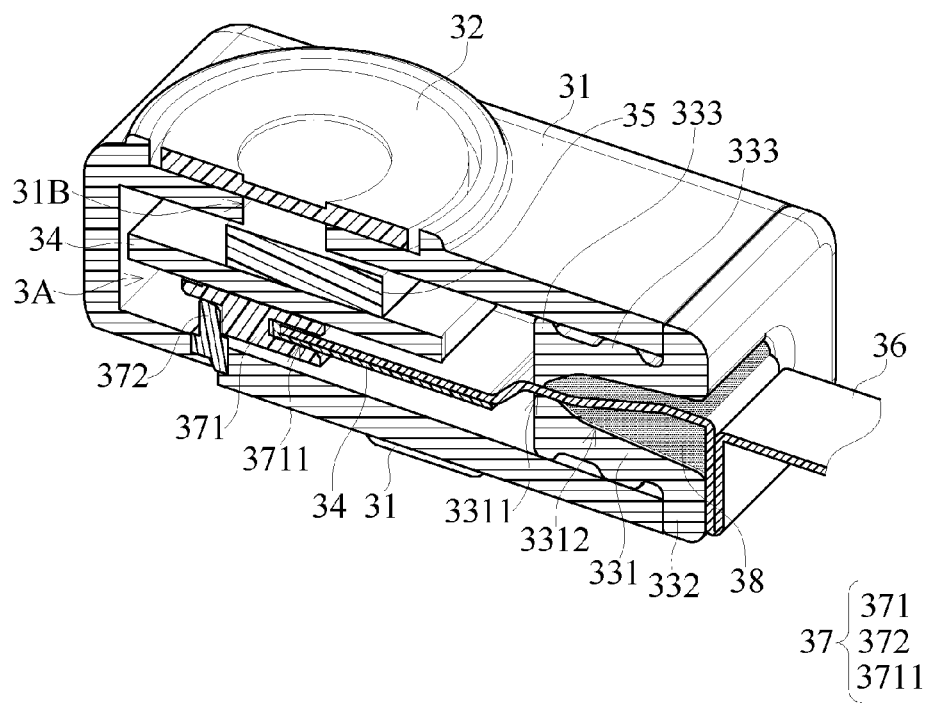
FIG. 5 is a partial section schematic diagram of a waterproof microphone kit of the present invention.
Figure 6:
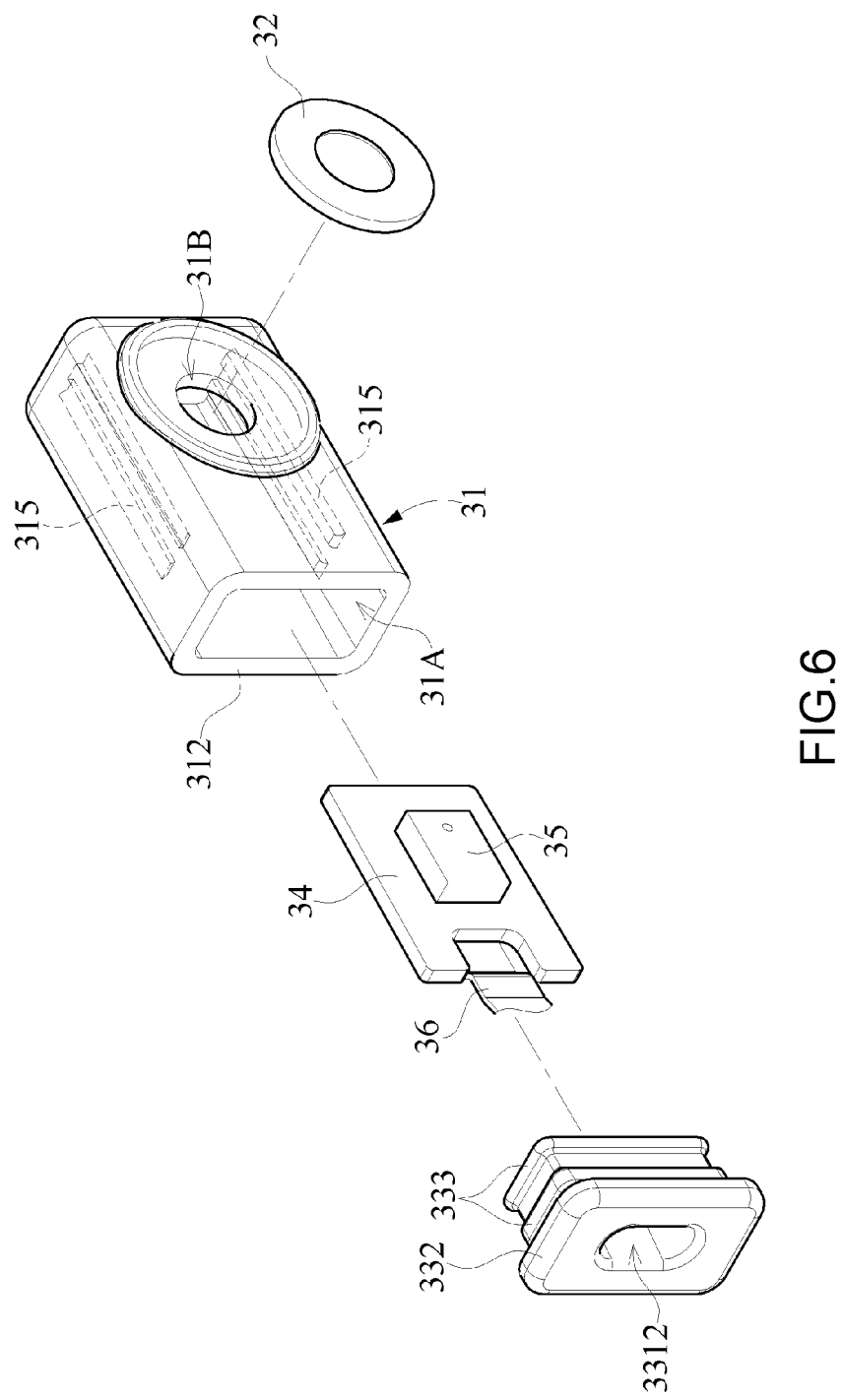
FIG. 6 is an exploded schematic diagram of a waterproof microphone kit of the present invention.
Figure 7:
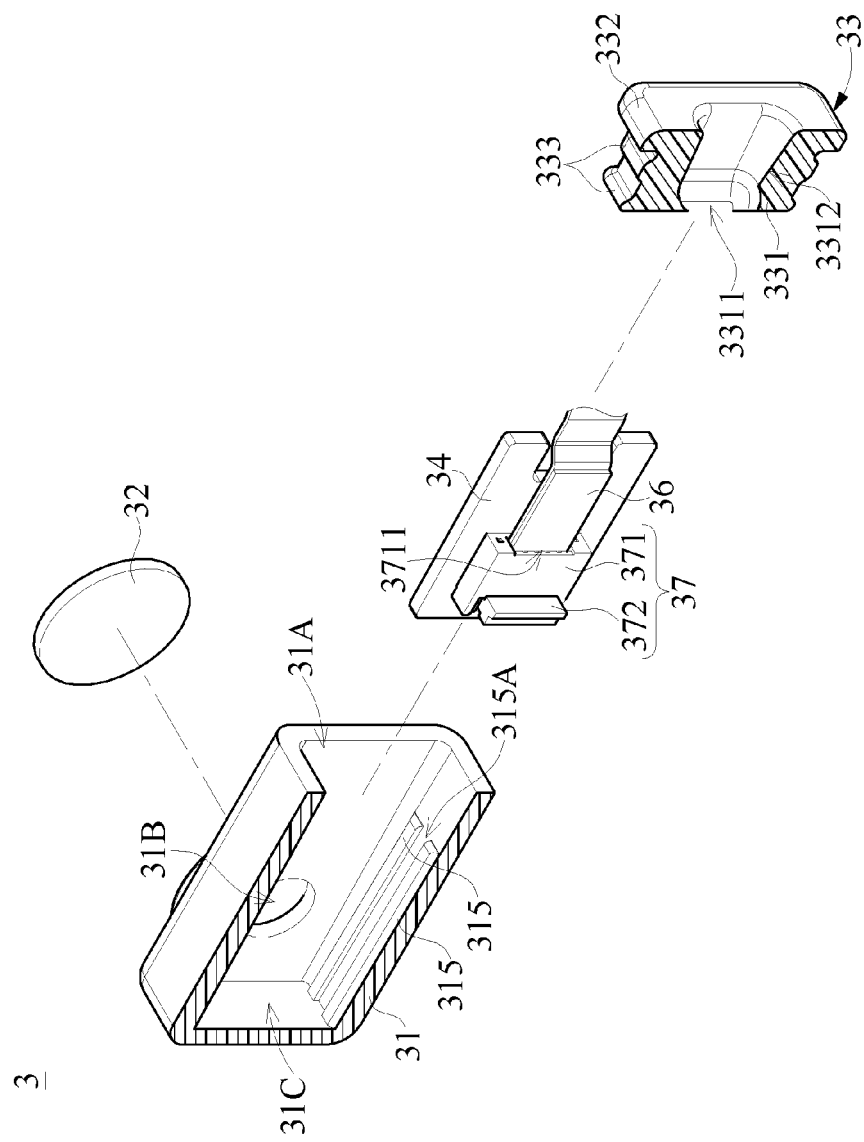
FIG. 7 is an exploded section schematic diagram of a waterproof microphone kit of the present invention.

As shown in FIG. 2 and FIG. 3, the waterproof microphone kit 3 is disposed at the body 1. In practice, the first body housing 11 of the body 1 may include a slot 111 and a fitting structure 112, with the fitting structure 112 being in the slot 111. A part of the waterproof microphone kit 3 is fixed in the slot 111, and a fitting member 313 of the waterproof microphone kit 3 can be correspondingly fitted with the fitting structure 112. In practice, the body 1 may further include a secondary housing 11A. The secondary housing 11A is detachably secured with the first body housing 11. A related individual may expose the slot 111 by removing the secondary housing 11A, to accordingly assemble or remove the waterproof microphone kit 3.

In practice, the fitting member 313 and the fitting structure 112 may be, for example but not limited to, tightly fixed with each other. Alternatively, the fitting member 313 and the fitting structure 112 may also provide assistance for positioning the waterproof microphone kit 3 in the slot 111. In practice, the fitting member 313 and the fitting structure 112 may have mutually corresponding asymmetrical shapes (e.g., triangular structures or irregularly shaped structures), and once a user mutually fits the fitting member 313 and the fitting structure 112, a sound receiving direction of the waterproof microphone kit 3 then faces the user.

In practice, the body 1 may further include a camera unit 14. The camera unit 14 captures an image in front of a display surface of the display unit 2, and a part of the slot 111 for disposing the waterproof microphone kit 3 may be disposed near the camera unit 14. Thus, when the user uses the camera unit 14 and the waterproof microphone kit 3 for real-time network transmission of video and audio, better experience of use can be achieved.

Referring to FIG. 3 to FIG. 7, the waterproof microphone kit 3 includes a housing 31, a waterproof breathable film 32, a plug 33, a circuit motherboard 34, a microphone unit 35 and a flexible electrical connection component 36. The waterproof microphone kit 3 of the present invention may be made, sold and implemented individually, and the waterproof microphone kit 3 is not limited to only being made, sold or implemented together with the electronic device 100 of the present invention.

One end of the housing 31 is provided with an opening 31A, one side of the housing 31 is provided with a lateral opening 31B, and the housing 31 includes therein an accommodating space 31C. The accommodating space 31C can be in communication with the exterior through the opening 31A and the lateral opening 31B. Specifically, the housing 31 may be a rectangular structure, the opening 31A may be formed on one end surface 312 of the housing 31, and the lateral opening 31B may be formed on a wide end surface connected to the end surface 312. It should be noted that the appearance of the housing 31 is not limited to the example depicted in the drawing.

In practice, the housing 31 may include the fitting member 313 above, with the fitting member 313 not located on the side provided with the waterproof breathable film 32. Specifically, the fitting member 313 may be located on another wide side surface 314 where the lateral opening 31B is formed. In practice, the fitting member 313 may be, for example, a protrusion that is a formed integral with the housing 31, and the fitting structure 112 of the body 1 is correspondingly a dent. When the fitting member 313 and the fitting structure 112 are mutually fitted, the fitting member 313 is correspondingly disposed in the dent.

The waterproof breathable film 32 is disposed on one side of the housing 31 and seals the lateral opening 31B, so that a liquid (e.g., water) outside the housing 31 cannot enter the housing 31 through the waterproof breathable film 32 and the lateral opening 31B, and sound waves can still however enter the housing 31 through the waterproof breathable film 32. For example, the waterproof breathable film 32 may be made of a material such as polytetrafluoroethene (PTFE).

A part of the plug 33 is disposed in the housing 31, the plug 33 plugs the opening 31A of the housing 31, and the plug 33, the waterproof breathable film 32 and the housing 31 jointly form an enclosed space 3A. That is, once the plug 33 plugs the opening 31A of the housing 31 and the waterproof breathable film 32 shields the lateral opening 31B, the accommodating space 31C in the housing 31 becomes the enclosed space 3A, and it is difficult for a liquid outside the enclosed space 3A to enter the enclosed space 3A through the housing 31. In practice, the plug 33 is made of a waterproof material, and has a through hole 3311. In practice, the plug 33 may include a body 331, an end portion 332 and two loop stoppers 333. One end of the body 331 is provided with the end portion 332, and the two loop stoppers 333 are disposed at an interval at the body 331. Outer diameters of the two loop stoppers 333 may be greater than an aperture of the opening 31A of the housing 31, so that when the plug 33 plugs the opening 31A, the two loop stoppers 333 tightly press against the inner side of the housing 31A and accordingly form together with the housing 31 two loop waterproof walls. When the plug 33 plugs the opening 31A, the end portion 332 correspondingly presses against the end surface 312 of the housing 31.

The circuit motherboard 34 is disposed in the housing 31. In practice, the circuit motherboard 34 may be fixed in the housing 31 by various means; for example, the circuit motherboard 34 may be fixed in the housing 31 by an adhesive. In a preferred embodiment, the housing 31 may have two limiting structures 315. The two limiting structures 315 are located on two inner sides of two sidewalls arranged facing each other, and the two limiting structures 315 are correspondingly located in the accommodating space 31C. Each of the limiting structures 315 may have a groove 315A, and the two sides of the circuit motherboard 34 may be correspondingly disposed in the two grooves 315A of the two limiting structures 315. Thus, the two limiting structures 315 limit the movement range of the circuit motherboard 34 disposed in the housing 31 relative to the housing 31.

The microphone unit 35 is disposed at the circuit motherboard 34, and a sound receiving part of the microphone unit 35 is disposed as facing the waterproof breathable film 32. In a preferred embodiment, with the design of the limiting structures 315, a related installation individual can more conveniently install the circuit motherboard 34 in the housing 31, allowing the sound receiving part of the microphone unit 35 to be accurately disposed as facing the waterproof breathable film 32.

In one specific embodiment, to enable a related individual to accurately dispose the sound receiving part of the microphone 35 as facing the waterproof breathable film 32 when installing the circuit motherboard 34, the housing 31 may be made of a transparent material. Thus, during the installation process of the circuit motherboard 34, the related individual is allowed to clearly see whether the microphone unit 35 is accurately disposed as facing the waterproof breathable film 32.

One end of the flexible electrical connection component 36 is connected to the circuit motherboard 34, the flexible electrical connection component 36 passes through the through hole 3311 of the plug 33, and the other end of the flexible electrical connection component 36 is for connecting to an external processing module (e.g., various microprocessors). In practice, the flexible electrical connection component 36 may be various flexible printed circuits (FPC). In a preferred embodiment, two opposite wide side surfaces of the circuit motherboard 34 may be disposed with the microphone 35 and an electrical connector seat 37, respectively. The electrical connector seat 37 may include a base 371 and a mobile member 372. The base 371 is fixed at the circuit motherboard 34, and includes a socket 3711, and the mobile 372 is movably connected to the base 371. A related installation individual first inserts one end of the flexible electrical connection component 36 into the socket 3711, and then manipulates the mobile member 372 to press the mobile member 372 against the flexible electrical connection component 36, thereby allowing a related electrical connection structure of the flexible electrical connection component 36 and a related electrical connection structure of the circuit motherboard 34 to be steadily mutually connected.

It should be noted that the connection between the flexible electrical connection component 36 and the circuit motherboard 34 is not limited to the example above. In a different embodiment, one end of the flexible electrical connection component 36 may also be provided with an electrical connection plug, and one side of the circuit motherboard 34 may be correspondingly provided with an electrical connection receptacle, wherein the electrical connection plug of the flexible electrical connection component 36 is for mutually plugging with the electrical connection receptacle of the circuit motherboard 34.

In practice, the aperture of the through hole 3311 of the plug 33 may be smaller than that of the through hole 3311 of the flexible electrical connection component 36. When a part of the flexible electrical connection component 36 passes through the through hole 3311 of the plug 33 and exits the accommodating space 3C of the housing 31, the part of the plug 33 with the through hole 3311 formed and the flexible electrical connection component 36 can remain mutually tightly connected, thereby achieving waterproofness to a certain extent.

According to the description above, in practice, a related individual first connects one end of the flexible electrical connection component 36 with the circuit motherboard 34, fixes the circuit motherboard 34 in the housing 31, then passes the other end of the flexible electrical connection component 36 through the through hole 3311 of the plug 33, and eventually plugs a part of the plug 33 at the opening 31A of the housing 31, thereby completing the assembly of the waterproof breathable kit 3. In the assembled waterproof breathable kit 3, the circuit motherboard 34, the microphone unit 35, and the part of the flexible electrical connection component 36 connected to the circuit motherboard 34 are all correspondingly located in the enclosed space 3A jointly formed by the plug 33, the waterproof breathable film 32 and the housing 31 and hence effectively protected.

In a preferred embodiment, one end of the plug 33 may be recessed to form an adhesive slot 3312. The adhesive slot 3312 is in communication with the through hole 3311, and the part of the flexible electrical connection component 36 passing through the through hole 3311 is correspondingly located in the adhesive slot 3312. The adhesive slot 3312 is filled with a sealing adhesive 38. The sealing adhesive 38 covers the electrical connection component in the adhesive slot 3312, and seals the through hole 3311. With the design of the adhesive slot 3312 and the sealing adhesive 38, better waterproofness can be achieved by the housing 31.

In conclusion, the waterproof microphone kit and the electronic device of the present invention provide better waterproofness using designs of the housing, the waterproof breathable film and the plug compared to a conventional microphone unit, thereby significantly eliminating the problem of inability of operation of the microphone unit caused influences from external moisture.

The description above provides merely some preferred feasible embodiments of the present invention and are not to be construed as limitations to the scope of protection of the present invention. Therefore, all equivalent technical modifications made based on the description and drawings of the present invention are to be encompassed within the scope of protection of the present invention.

What is claimed is:

1. A waterproof microphone kit, adapted to be fixed in an electronic device, the waterproof microphone kit comprising:
    a housing, comprising an integral structure, a first limiting structure, and a second limiting structure extending parallel to the first limiting structure, the integral structure having only two openings, the two openings consisting of a first opening on one end of the housing and a second opening on a first side of the housing, and a fitting member, the fitting member located on a second side of the housing opposite to the first side, wherein the fitting member has an asymmetrical shape, and a longest dimension of the first limiting structure and a longest dimension of the second limiting structure extend in a first direction toward the first opening;
    a waterproof breathable film, disposed on an exterior surface of the housing and sealing the second opening;
    a plug, received in the first opening and partially disposed in the housing, wherein the waterproof breathable film, the plug and the housing jointly form an enclosed space;
    a circuit motherboard, disposed in the housing and located in the enclosed space, wherein the circuit motherboard is configured to be disposed between the first limiting structure and the second limiting structure;
    a microphone unit, disposed at the circuit motherboard and located in the enclosed space, a sound receiving part of the microphone unit disposed as facing the waterproof breathable film;
    an electrical connector seat; and
    a flexible electrical connection component,
    wherein the flexible electrical connection component is insertable into the electrical connector seat and forms an electrical connection to the circuit motherboard through the electrical connector seat, and the circuit motherboard and the microphone unit are shaped to fit through the first opening during assembly.

2. The waterproof microphone kit according to claim 1, wherein the housing is in a transparent material.

3. The waterproof microphone kit according to claim 1, wherein the plug has a through hole, the flexible electrical connection component passes through the through hole, one end of the flexible electrical connection component is connected to the circuit motherboard, one other end of the flexible electrical connection component is configured to connect to an external processing module, one end of the plug is recessed to form an adhesive slot, the adhesive slot is filled with a sealing adhesive, the adhesive slot is in communication with the through hole, a part of the flexible electrical connection component passing through the through hole is located in the adhesive slot, the sealing adhesive covers the flexible electrical connection component in the adhesive slot, and the sealing adhesive seals the through hole.

4. The waterproof microphone kit according to claim 1, wherein the first limiting structure and the second limiting structure are for limiting a movement range of the circuit motherboard disposed in the housing relative to the housing.

5. The waterproof microphone kit according to claim 1, wherein the fitting member is for mutually fitting with a fitting structure in a slot of the electronic device so as to fix the waterproof microphone kit to the electronic device.

6. An electronic device, comprising:
 a body, comprising a processing module and a slot having a fitting structure;
 a display unit, connected to the body and electrically connected to the processing module, wherein the processing module is capable of controlling the display unit; and
 a waterproof microphone kit, disposed at the body, the waterproof microphone kit comprising:
  a housing, comprising an integral structure, a first limiting structure, and a second limiting structure extending parallel to the first limiting structure, the integral structure having a first opening on one end of the housing, a second opening on a first side of the housing, and a fitting member, the fitting member located on a second side of the housing opposite to the first side, wherein a longest dimension of the first limiting structure and a longest dimension of the second limiting structure extend in a first direction toward the first opening;
  a waterproof breathable film, disposed on an exterior surface of the housing and sealing the second opening;
  a plug, received in the first opening and partially disposed in the housing, wherein the waterproof breathable film, the plug and the housing jointly form an enclosed space;
  a circuit motherboard, disposed in the housing and located in the enclosed space, wherein the circuit motherboard is configured to be disposed between the first limiting structure and the second limiting structure;
  a microphone unit, disposed at the circuit motherboard and located in the enclosed space, a sound receiving part of the microphone unit disposed as facing the waterproof breathable film;
  a electrical connector seat; and
  a flexible electrical connection component,
  wherein the flexible electrical connection component is insertable into the electrical connector seat and forms an electrical connection to the circuit motherboard through the electrical connector seat, the fitting member is adapted to mutually fit with the fitting structure so as to fix the waterproof microphone kit to the body, the fitting member and the fitting structure have mutually corresponding asymmetrical shapes, and the circuit motherboard and the microphone unit are shaped to fit through the first opening during assembly.

7. The electronic device according to claim 6, wherein the housing is in a transparent material.

8. The electronic device according to claim 6, wherein the plug has a through hole, the flexible electrical connection component passes through the through hole, one end of the flexible electrical connection component is connected to the circuit motherboard, one other end of the flexible electrical connection component is configured to connect to an external processing module, one end of the plug is recessed to form an adhesive slot, the adhesive slot is filled with a sealing adhesive, the adhesive slot is in communication with the through hole, a part of the flexible electrical connection component passing through the through hole is located in the adhesive slot, the sealing adhesive covers the flexible electrical connection component in the adhesive slot, and the sealing adhesive seals the through hole.

9. The electronic device according to claim 6, wherein the first limiting structure and the second limiting structure are for limiting a movement range of the circuit motherboard disposed in the housing relative to the housing.

10. The waterproof microphone kit according to claim 1, wherein the fitting member is a protrusion from a surface of the second side.

11. The electronic device according to claim 6, wherein the fitting member is a protrusion from a surface of the second side and the fitting structure is a recess in a surface of a wall of the slot.

12. The waterproof microphone kit according to claim 1, wherein the housing is transparent.

13. The electronic device according to claim 6, wherein the housing is transparent.

14. The waterproof microphone kit according to claim 1, wherein the first limiting structure and the second limiting structure are is a protrusions extending from a surface of the housing.

15. The waterproof microphone kit according to claim 1, wherein the electrical connector seat comprises a socket into which the flexible electrical connection component is configured to be inserted into the electrical connector seat.

16. The waterproof microphone kit according to claim 1, wherein the plug comprises a loop stopper disposed between a first end portion of the plug and a second end portion of the plug on a diametrically opposite side of the plug relative to the first end portion, and the loop stopper is defined as a raised portion between the first end portion and the second end portion.

17. The electronic device according to claim 6, wherein the fitting structure defines a recess into which the fitting member is disposed.

18. The electronic device according to claim 6, wherein the electrical connector seat comprises a socket into which the flexible electrical connection component is configured to be inserted into the electrical connector seat.

19. The electronic device according to claim 6, wherein the plug comprises a loop stopper disposed between a first end portion of the plug and a second end portion of the plug on a diametrically opposite side of the plug relative to the first end portion, and the loop stopper is defined as a raised portion between the first end portion and the second end portion.

20. The electronic device according to claim 6, wherein the first limiting structure and the second limiting structure are protrusions extending from a surface of the housing.

* * * * *